(12) United States Patent
Hshieh (10) Patent No.: US 7,816,729 B2
(45) Date of Patent: Oct. 19, 2010

(54) TRENCHED MOSFET DEVICE WITH TRENCHED CONTACTS

(76) Inventor: Fwu-Iuan Hshieh, 20768 Sevilla La., Saratoga, CA (US) 95070

( * ) Notice: Subject to any disclaimer, the term of this patent is extended or adjusted under 35 U.S.C. 154(b) by 41 days.

(21) Appl. No.: 11/518,729

(22) Filed: Sep. 10, 2006

(65) Prior Publication Data

US 2008/0035988 A1 Feb. 14, 2008

Related U.S. Application Data (60) Provisional application No. 60/836,344, filed on Aug. 8, 2006.

(51) Int. Cl.
*H01L 29/94* (2006.01)
*H01L 29/76* (2006.01)
*H01L 31/00* (2006.01)

(52) U.S. Cl. .................. 257/330; 257/328; 257/329; 257/341; 257/401; 257/E29.027; 257/E29.028

(58) Field of Classification Search .............. 257/341, 257/401, 330, E29.121, E29.027, E29.028, 257/328, 329

See application file for complete search history.

(56) References Cited

U.S. PATENT DOCUMENTS

| | | | | |
|---|---|---|---|---|
| 4,791,462 A | * | 12/1988 | Blanchard et al. | 257/260 |
| 5,316,959 A | * | 5/1994 | Kwan et al. | 438/270 |
| 6,720,616 B2 | * | 4/2004 | Hirler et al. | 257/330 |
| 2003/0178676 A1 | * | 9/2003 | Henninger et al. | 257/340 |
| 2003/0222297 A1 | * | 12/2003 | Krumrey et al. | 257/302 |
| 2005/0145936 A1 | * | 7/2005 | Polzl et al. | 257/341 |
| 2005/0151190 A1 | * | 7/2005 | Kotek et al. | 257/341 |
| 2006/0273385 A1 | * | 12/2006 | Hshieh | 257/330 |

OTHER PUBLICATIONS

Quirk et al., Semiconductor Manufacturing Technology, 2001, Prentice Hall, pp. 216-217, 312.*

* cited by examiner

*Primary Examiner*—Eugene Lee
*Assistant Examiner*—Peniel M Gumedzoe
(74) *Attorney, Agent, or Firm*—Bo-In Lin (57) ABSTRACT

A trenched semiconductor power device that includes a trenched gate disposed in an extended continuous trench surrounding a plurality of transistor cells in an active cell area and extending as trench-gate fingers to intersect with a trenched gate under the gate metal runner at a termination area. At least one of the trench-gate fingers intersects with the trenched gate under the gate metal runner near the termination area having trench intersection regions vulnerable to have a polysilicon void and seam developed therein. At least a gate contact trench opened through an insulation layer covering the semiconductor power device wherein the gate contact trench penetrating from the insulation layer and extending into the gate polysilicon and the gate contact trench is opened in an area away from the trench intersection regions and also away from a center portion of said the trenched gate underneath said gate runner metal where a polysilicon void or a seam is likely formed thus avoid the formation of the vulnerable spots.

18 Claims, 15 Drawing Sheets

TRENCHED MOSFET DEVICE WITH TRENCHED CONTACTS

This Formal Application claims a Priority Date of Aug. 8, 2006 benefited from a Provisional Patent Applications 60/836,344 filed by the same Applicant of this Application.

BACKGROUND OF THE INVENTION

1. Field of the Invention

This invention relates generally to the cell structure, device configuration and fabrication process of power semiconductor devices. More particularly, this invention relates to a novel and improved cell structure, device configuration and improved process for fabricating a trenched semiconductor power device with improved increased cell density by reducing a gate to source contact critical dimension (CD) requirement.

2. Description of the Related Art

Figure 1A:
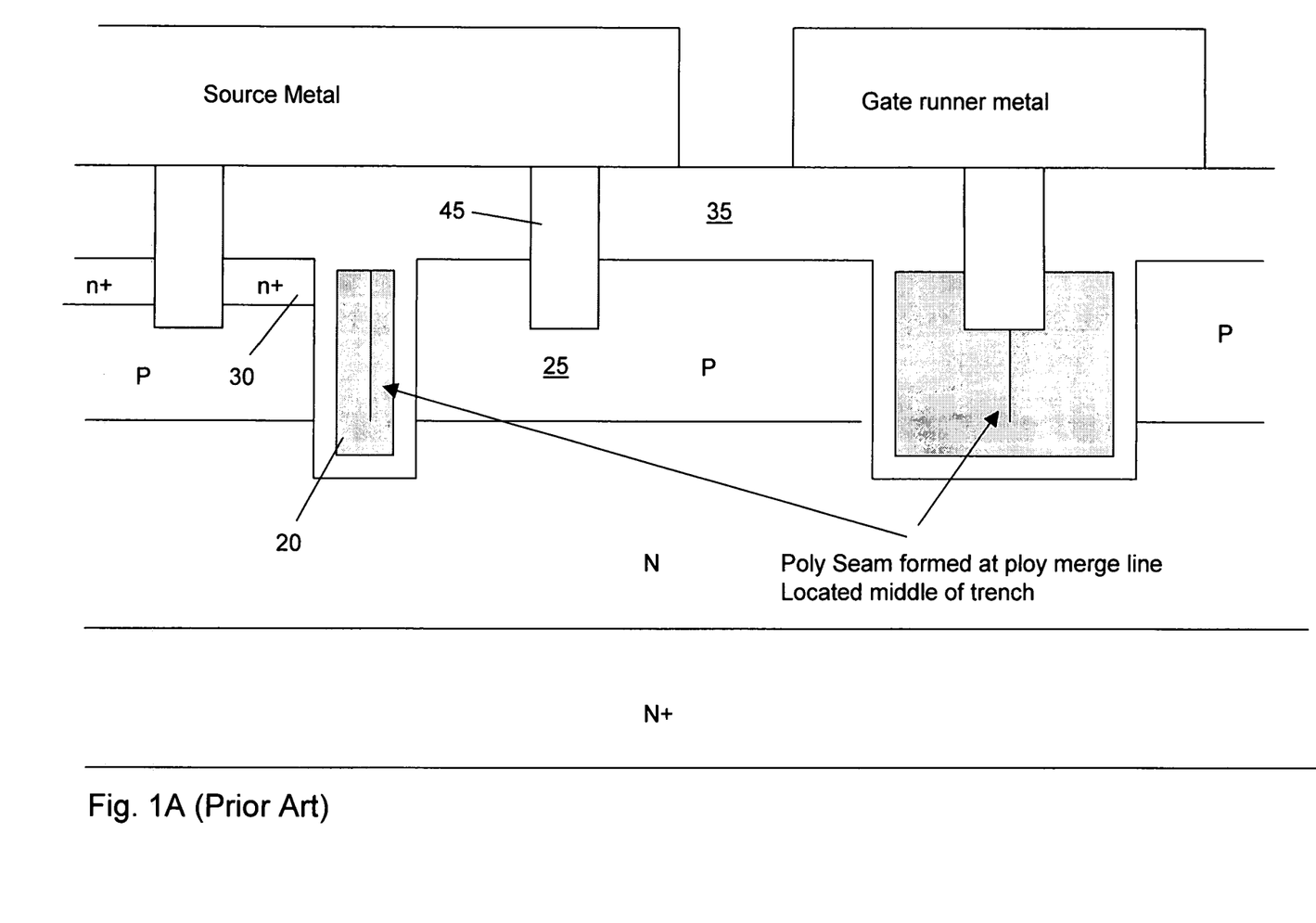
FIGS. 1A to 1F are side cross sectional views and top views of a MOSFET device configuration to increase the transistor cell density disclosed in related Patent Applications and also the potential problems that may be caused by polysilicon holes and seams.

In order to further increase the cell density in a semiconductor power device, the MOSFET devices are manufactured with trenched source contact plugs with the plugs formed with tungsten to reduce the distance between the gate and the source contact. Specifically, the Applicant of this Patent Application has filed another patent application Ser. No. 11/147,075 on Jun. 6, 2005 to improve the cell density by reducing the distance between the source contacts 45 and the trenched gates 20. An improved configuration of a MOSFET device is shown in FIG. 1 wherein the distance between the source contacts 45 and the trenched gates 20 are reduced by placing the source contact 45 in the source-body contact trenches opened in an oxide layer 35. As shown in FIG. 1A, the source-body contact 45 in the trenches extend into the body regions 25 thus contacting both the source regions 30 and the body regions 25 to provide improved and more reliable electric contacts. The difficulties of the conventional technologies to further increase the cell density due to the requirement of a large critical dimension (CD) between the source contacts and the trench gates is relaxed.

However, with tungsten plugs implemented as source and gate contact, there are still additional technical challenges confronted with such device configuration and manufacturing processes. Specifically, before refilling the contact trenches with tungsten plug or aluminum alloy, contact silicon etch is required after the oxide-etch is completed to form the contact trenches through the insulating dielectric layer(s). Potential problems may arise in carrying out the contact silicon etch due to the possibility of etching through the polysilicon gate unless special layout are prearranged to prevent such possibilities. The etch through problem may likely occur due to the formation of the polysilicon seam or holes in the middle portion of the poly-gate during the process of polysilicon deposition as that shown in FIG. 1A. If the etch through occurs, the tungsten plug or aluminum alloy may short through the gate oxide and drain at the trench bottom thus causing device reliability problems.

Figure 1B:
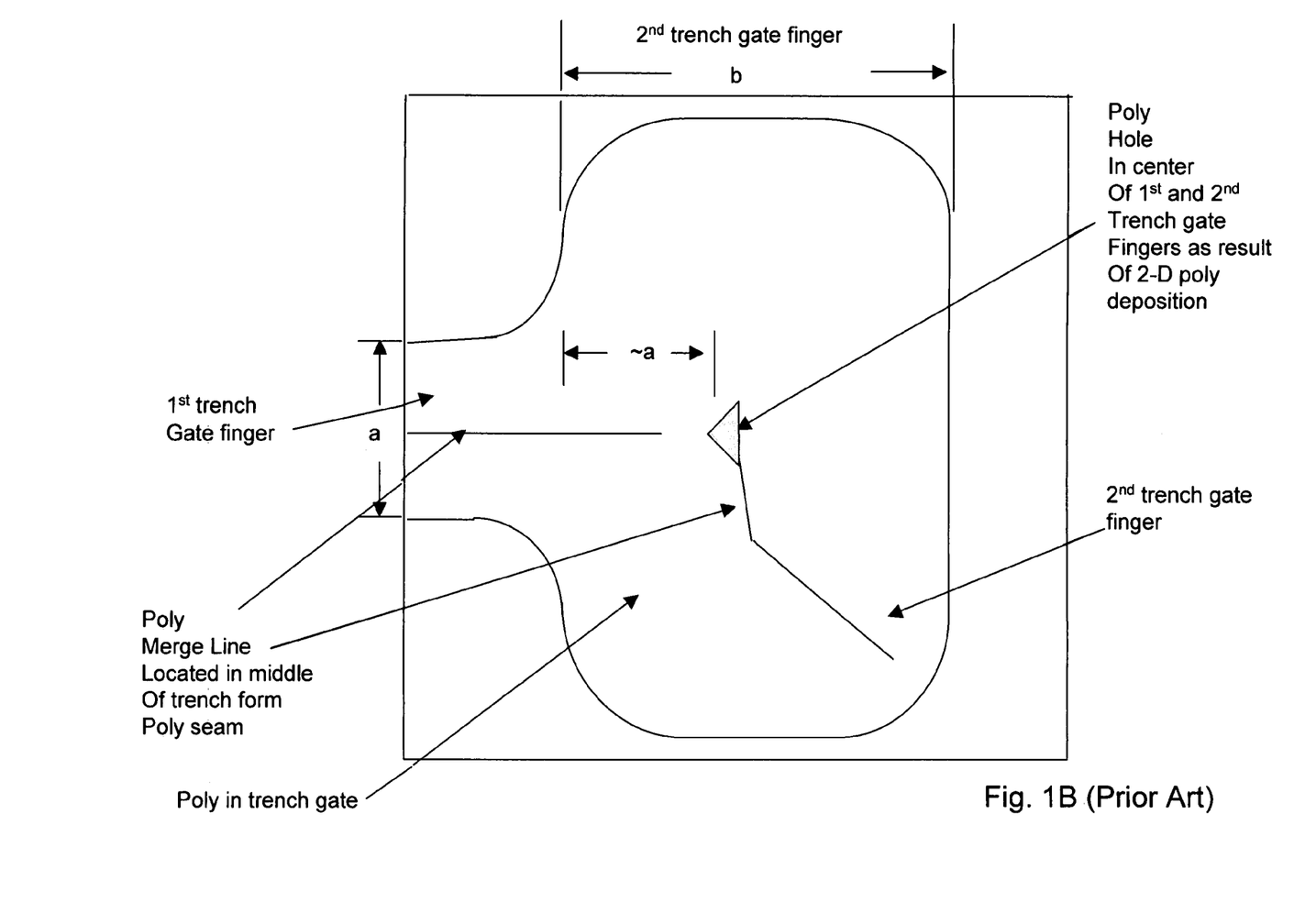
Figure 1C:
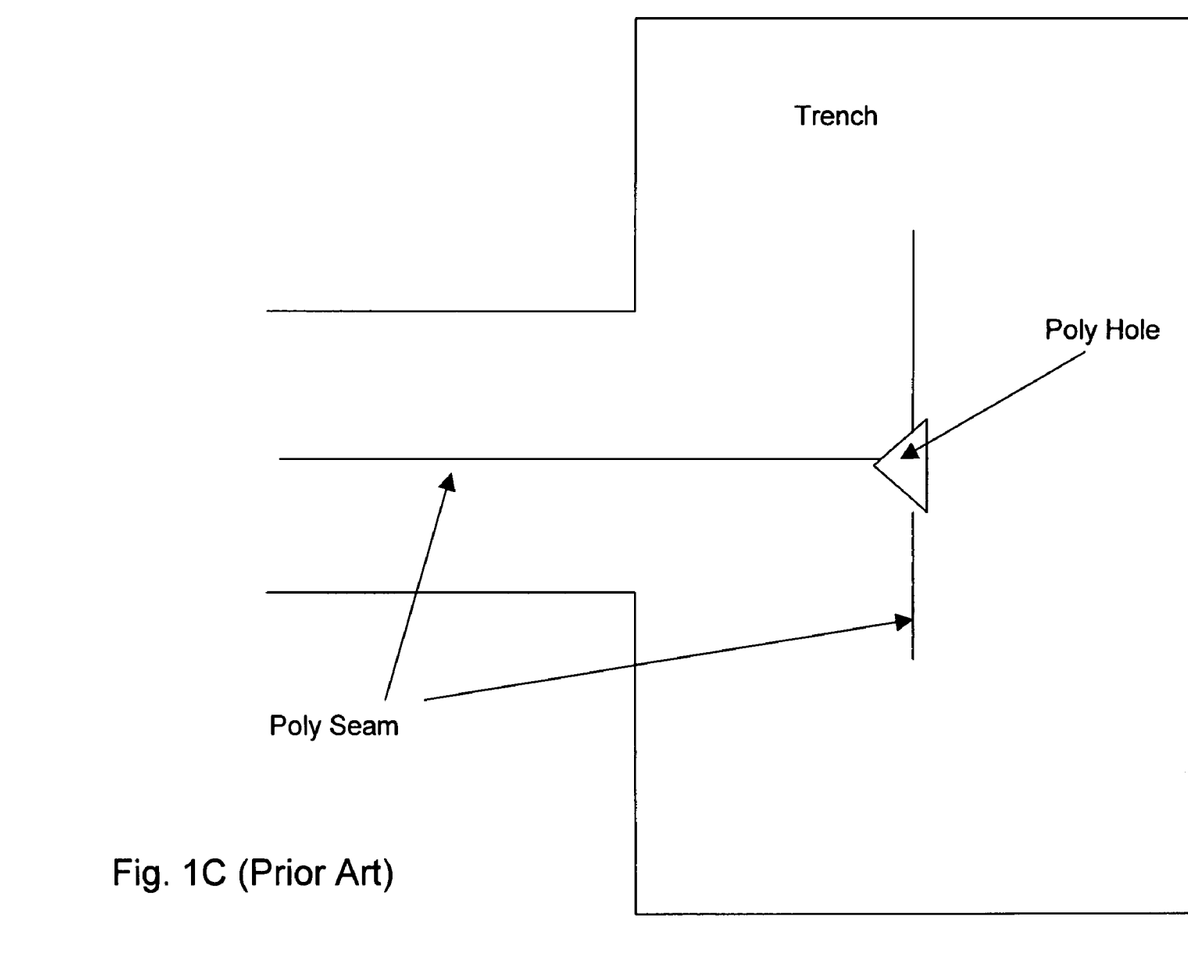
Figure 1D:
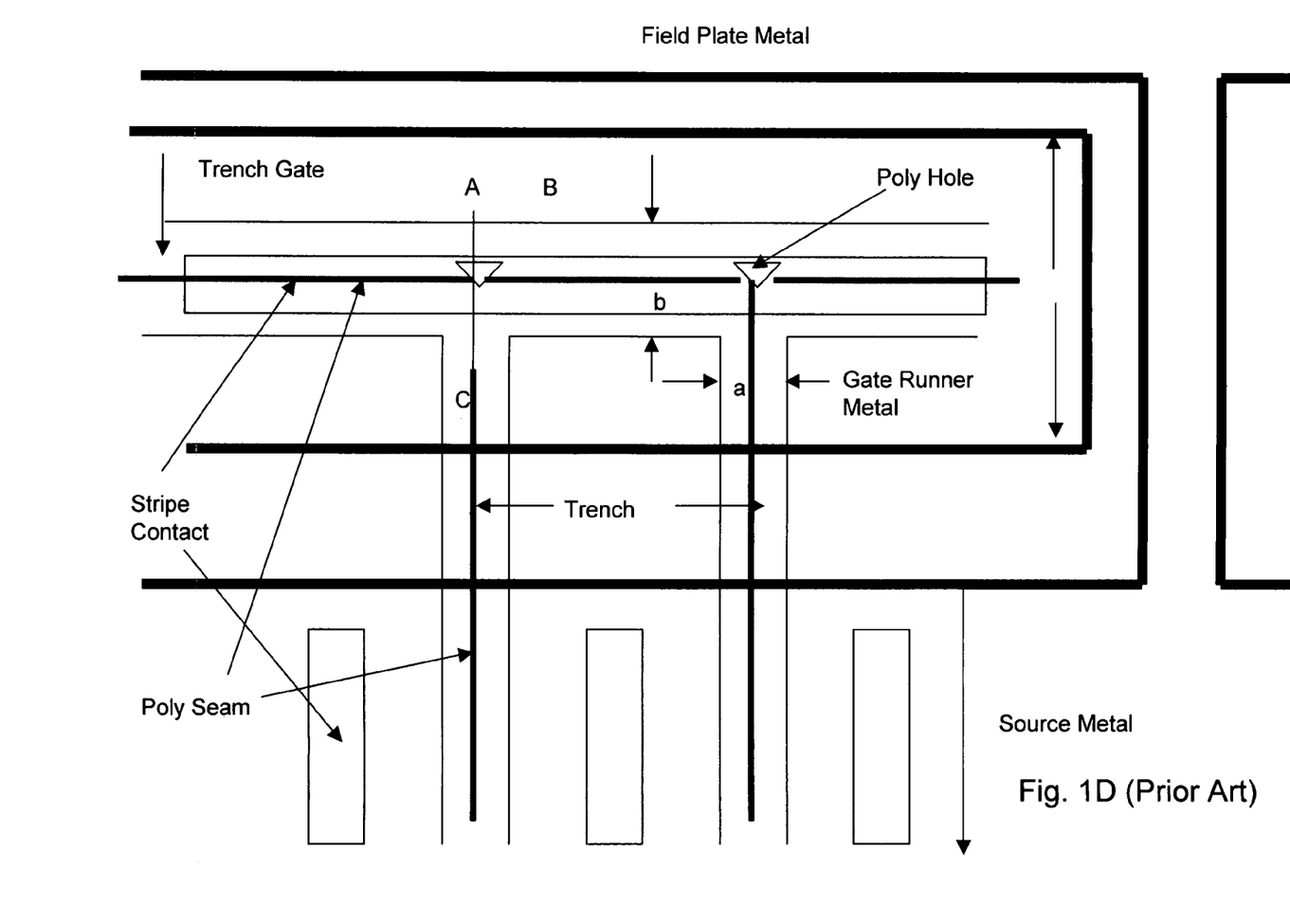
Figure 1E:
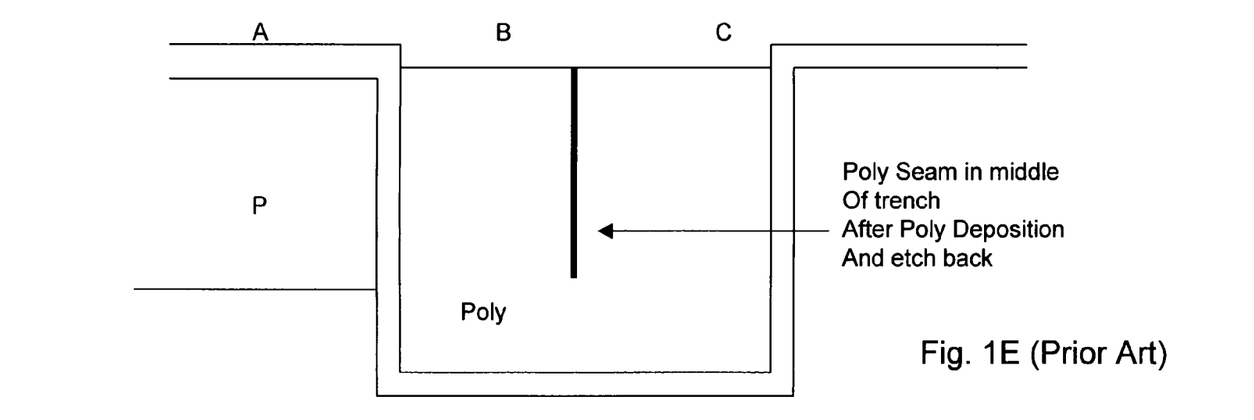
Figure 1F:
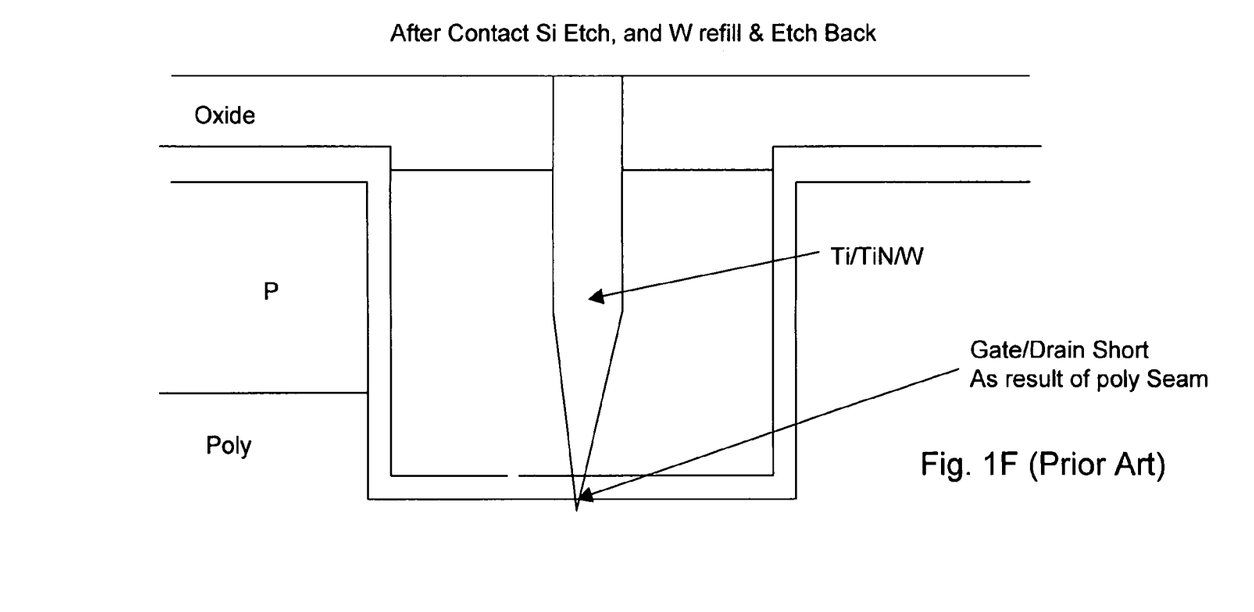

Furthermore, the contact silicon etch may etch through trench gate polysilicon with a T-intersection layout due to polysilicon hole and seam formation during the process of a polysilicon deposition in certain trenched gate area as shown in FIGS. 1B and 1C as the result of two dimensional polysilicon deposition. With such etch through holes penetrated through the polysilicon gates, the tungsten plug when filling in the contact trenches also filling into such etch-through holes thus generating an electrical short circuit through the gate oxide and the drain at trench bottom shown in FIGS. 1D to 1F. The etch-through problem with the holes penetrating through the polysilicon layer thus often causes a gate-to-drain shortage and raising device performance reliability issues.

Therefore, there is still a need in the art of the semiconductor device fabrication, particularly for trenched power MOSFET design and fabrication, to provide a novel cell structure, device configuration and fabrication process that would resolve these difficulties and design limitations.

SUMMARY OF THE PRESENT INVENTION

It is therefore an object of the present invention to provide new and improved semiconductor power device configuration, such as a MOSFET device that comprises tungsten contact plugs disposed in trenches disposed away from the trench intersection areas. By opening contact trenches away from the trench intersection areas and away from the trench center, the problem of etching through polysilicon holes due to the etching process in opening the trenches for contact plugs is minimized. The problems as that encountered in the manufacturing processes as discussed above are resolved.

Briefly, in a preferred embodiment, the present invention discloses a trenched semiconductor power device that includes a trenched gate disposed in an extended continuous trench surrounding a plurality of transistor cells in an active cell area and extending as trench-gate fingers to intersect with a trenched gate under the gate metal runner at a termination area. At least one of the trench-gate fingers intersects with the trenched gate under the gate metal runner near the termination area having trench intersection regions vulnerable to have a polysilicon void developed therein. At least a gate contact trench opened through an insulation layer covering the semiconductor power device wherein the gate contact trench penetrating from the insulation layer and extending into the gate polysilicon and the gate contact trench is opened in an area away from the trench intersection regions where the polysilicon voids may be formed, and away from a center portion of the trench gate under the gate metal runner where a polysilicon seam is formed. In a preferred embodiment, the trench intersection regions constitute a T-shaped intersection region. In a preferred embodiment, the gate contact trench is filled with a conductive gate contact plug. In a preferred embodiment, the gate contact trench is filled with a tungsten gate contact plug. In a preferred embodiment, the gate contact trench is filled with a tungsten gate contact plug surrounded with a Ti/TiN barrier layer. In a preferred embodiment, the gate contact trench is filled with a Ti/TiN/Al alloys. In a preferred embodiment, the trenched gate under the gate metal runner is configured as an open stripe extending from and intersecting to the trench-gate fingers as an L-shaped trenched gate under the gate metal runner with the width of gate contact trench smaller than half of a width of the trench-gate. In a preferred embodiment, the trenched gate under the gate metal runner is configured as an open stripe extending from and intersecting to the trench-gate fingers as an expanded square-shaped, or rectangular-shaped trenched gate under the gate metal runner with the width of gate contact trench smaller than half of a width of the trench-gate. In a preferred embodiment, the trenched gate under the gate metal runner is configured as an open stripe extending from and intersecting to the trench-gate fingers as an L-shaped trenched gate under the gate metal runner with the width of gate contact trench smaller than half of a width of the trench-gate. In a preferred embodiment, the trenched gate under the gate metal runner is configured as an open stripe extending from and intersecting to the trench-gate fingers as an circle-shape trenched gate under the gate metal runner with the width of gate contact trench smaller than half of diameter of the trench-gate. In a preferred embodiment, the trenched gate under the gate metal runner is configured as a no-open-end trenched gate under the gate metal runner perpendicularly intersecting to the trench-gate fingers with the gate contact trench opened at a distance S away from an intersecting edge of each of the trench-gate fingers with the no-open-end trenched gate under the gate metal runner with the width of gate contact trench smaller than half of a width of the trench-gate. In a preferred embodiment, the trenched gate underneath the gate metal runner is configured as an open stripe trenched gate extending from and having a greater width than the trench-gate fingers wherein the open stripe allowing a body region, i.e., the region 125 in FIG. 3A, disposed adjacent to a source region of the semiconductor power device connecting to a body, i.e., region 126 in FIG. 3A, underneath a metal field plate served by the gate runner metal. In a preferred embodiment, the trenched gate underneath the gate metal runner is configured as an open stripe extending from and intersecting to the trench-gate fingers as an L-shaped trenched gate underneath the gate metal runner and having a greater width than the trench-gate fingers wherein the L-shaped open stripe allowing a body region disposed adjacent to a source region of the semiconductor power device connecting to a body-dopant region underneath a metal field plate served by gate metal runner.

These and other objects and advantages of the present invention will no doubt become obvious to those of ordinary skill in the art after having read the following detailed description of the preferred embodiment, which is illustrated in the various drawing figures.

DETAILED DESCRIPTION OF THE PREFERRED EMBODIMENT

Figure 2A:
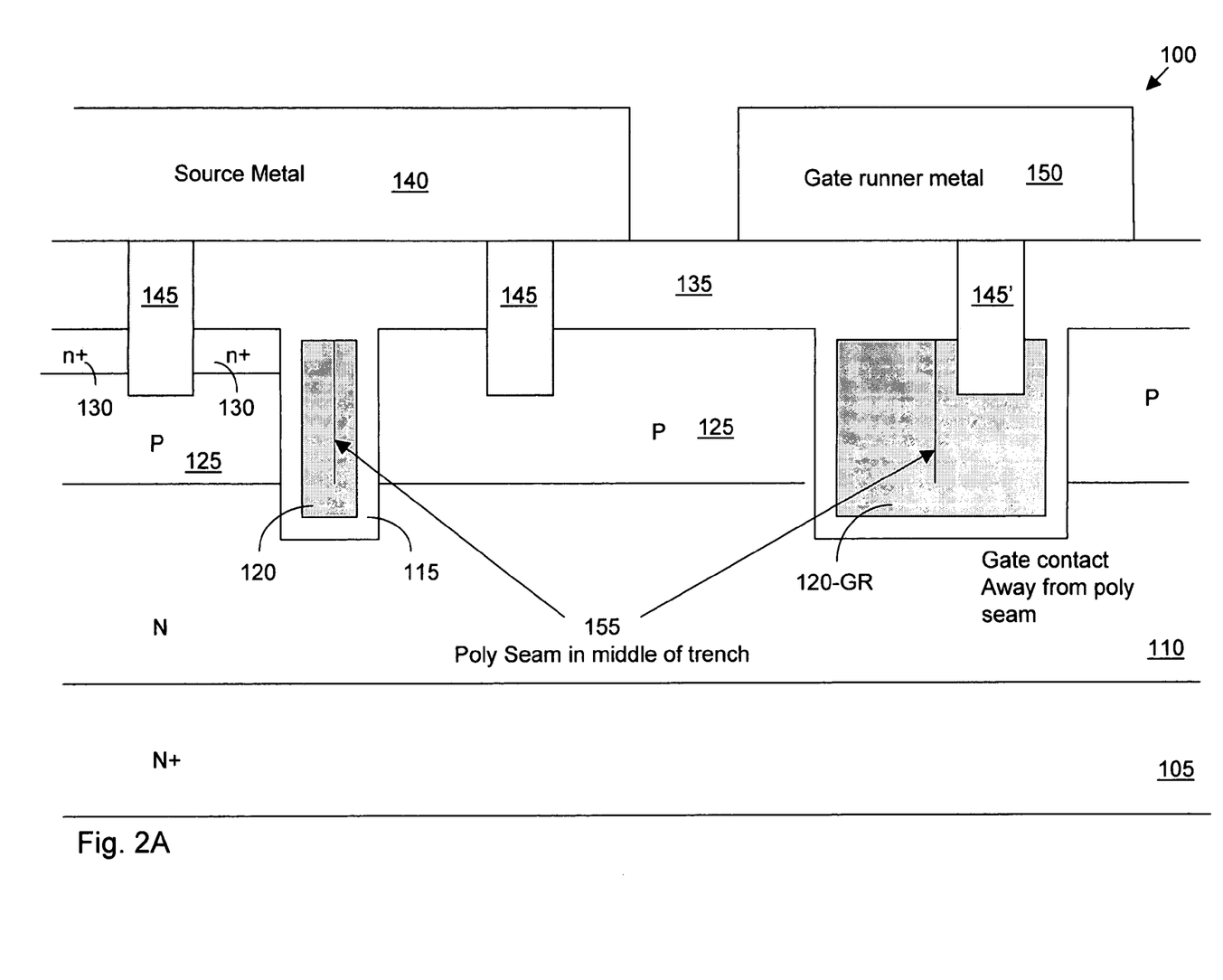
FIGS. 2A to 2C are cross sectional views and top views of an improved device configuration of this invention to prevent gate-drain short circuit problems.
Figure 2B:
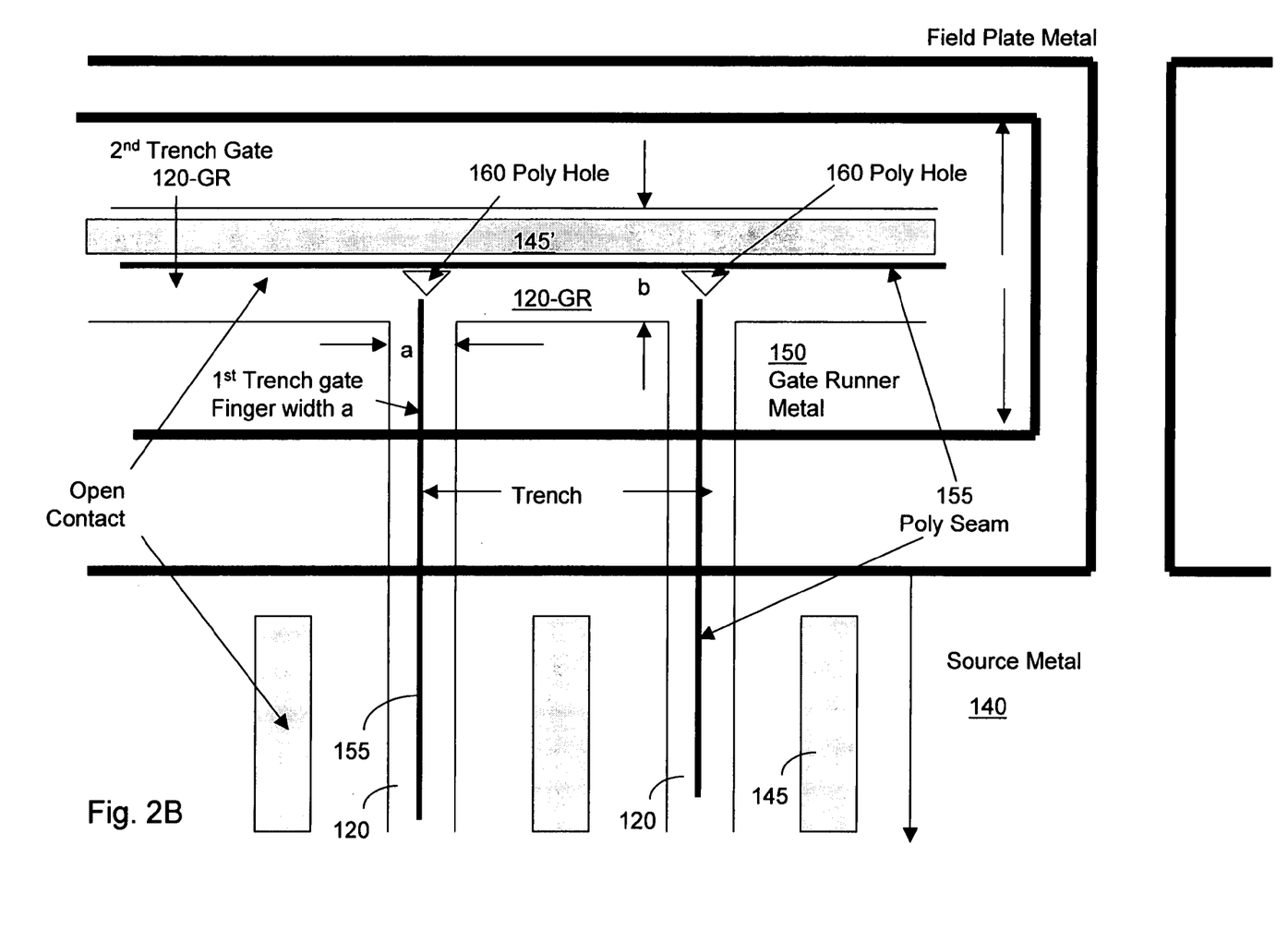
Figure 2C:
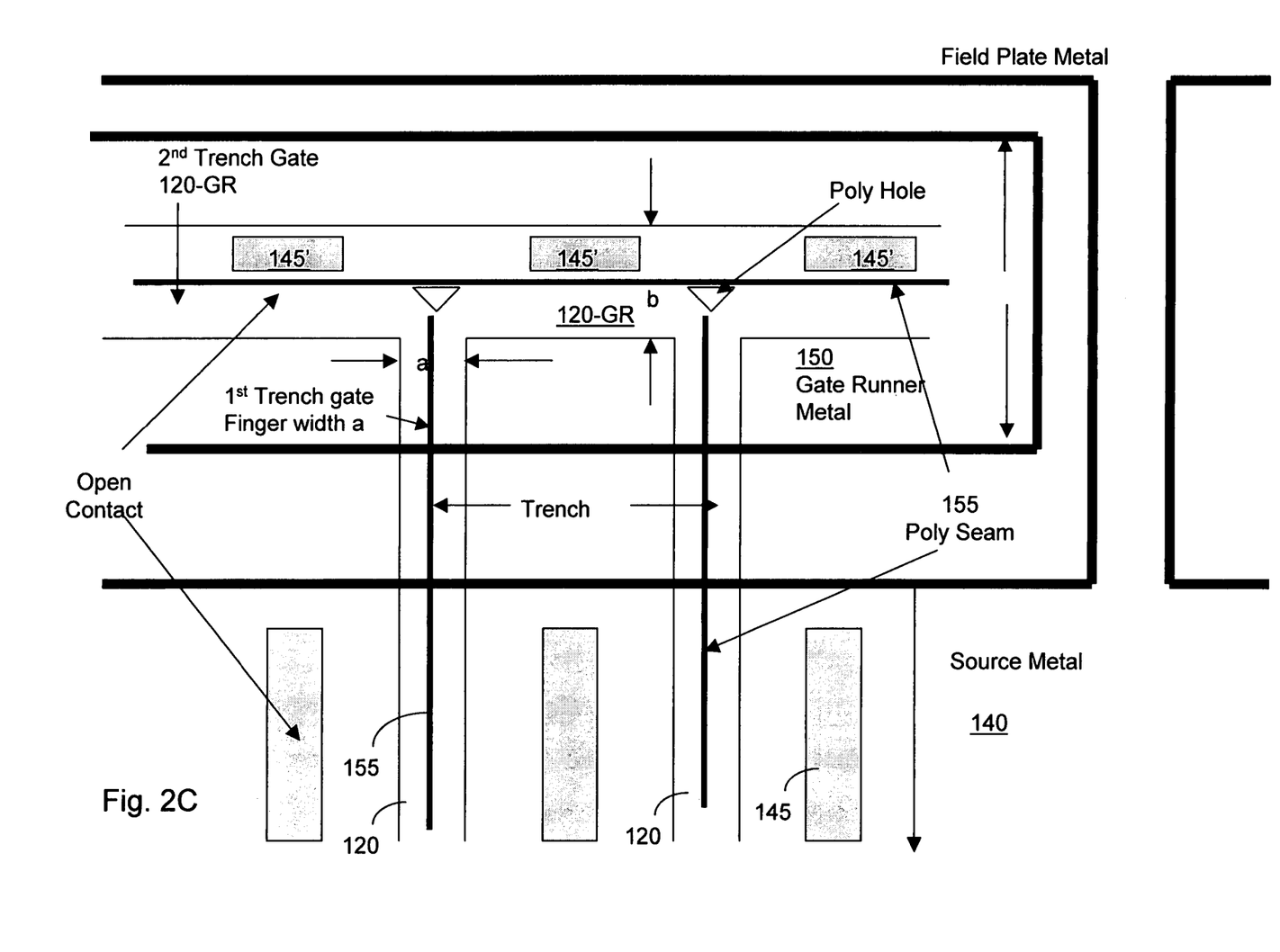

Please refer to FIGS. 2A to 2C for the side cross sectional view and two top views of a first preferred embodiment of this invention. A metal oxide semiconductor field effect transistor (MOSFET) device 100 is supported on a substrate 105 formed with an epitaxial layer 110. The MOSFET device 100 includes a trenched gate 120 disposed in a trench with a gate insulation layer 115 formed over the walls of the trench. A body region 125 that is doped with a dopant of second conductivity type, e.g., P-type dopant, extends between the trenched gates 120. The P-body regions 125 encompassing a source region 130 doped with the dopant of first conductivity, e.g., N+ dopant. The source regions 130 are formed near the top surface of the epitaxial layer surrounding the trenched gates 120. The top surface of the semiconductor substrate extending over the top of the trenched gate, the P body regions 125 and the source regions 130 are covered with a NSG and a BPSG dielectric layers 135. A source metal layer 140 and gate metal runner layer 150 are formed on top of the protective insulation layer 135.

For the purpose of improving the source contact to the source regions 130, a plurality of trenched source contact filled with a tungsten plug or aluminum alloys 145 that is surrounded by a barrier layer Ti/TiN. The contact trenches are opened through the NSG and BPSG dielectric layers 135 to contact the source regions 130 and the P-body 125. A top contact layer 140 is then formed on top of the source contact 145. The top contact layer 140 is formed with aluminum, aluminum-copper, AlCuSi, or Ni/Ag, Al/NiAu, AlCu/NiAu or AlCuSi/NiAu as a wire-bonding layer. In order to avoid a gate/drian shortage due to the poly hole and seam in the trench gate under gate metal runner, gate contacts are formed in the regions that are away from the locations where the polysilicon voids or seams are likely to form, and filled with a tungsten plug or aluminum alloys 145'.

In order to further increase the active areas for ultra high cell density MOSFET device, a specially configured termination structure is disclosed in the present invention. The gate runner metal 150 is disposed in the termination area on top of a gate runner 120-GR. In order to assure good contact to the gate runner 120-GR, a trenched gate runner contact plug 145' is formed on top of the gate runner 120-GR. The gate-runner contact plug 145' is composed of tungsten surrounded by a Ti/TiN barrier layer. For the purpose of avoiding the poly-etch through problem, the tungsten gate-runner contact plugs 145' are formed away from the center seam of the polysilicon gate runner 120-GR.

Figure 3A:
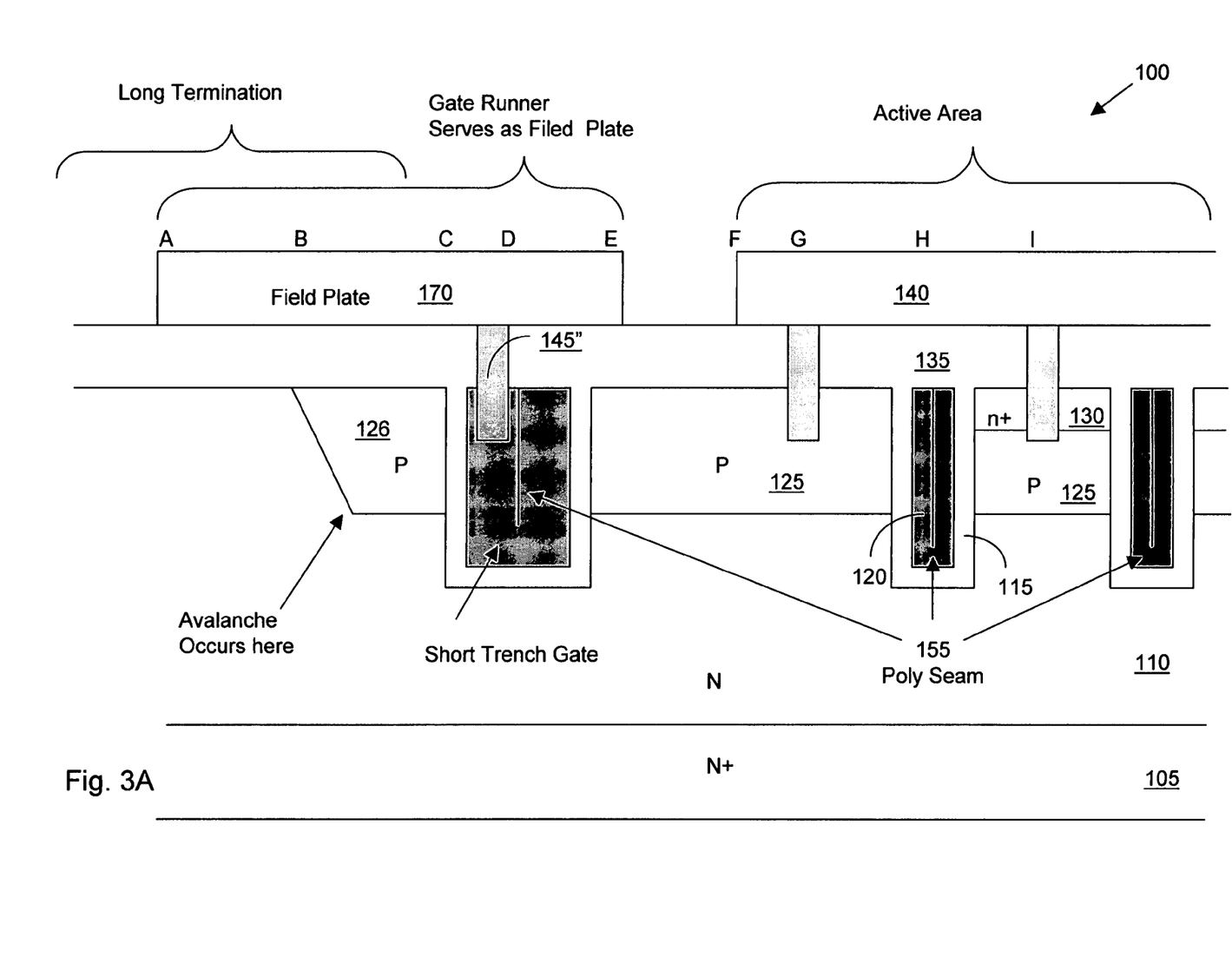
FIGS. 3A to 3D are cross sectional views and top views of alternate preferred embodiment with improved device configurations of this invention to prevent gate-drain short circuit problems.
Figure 3B:
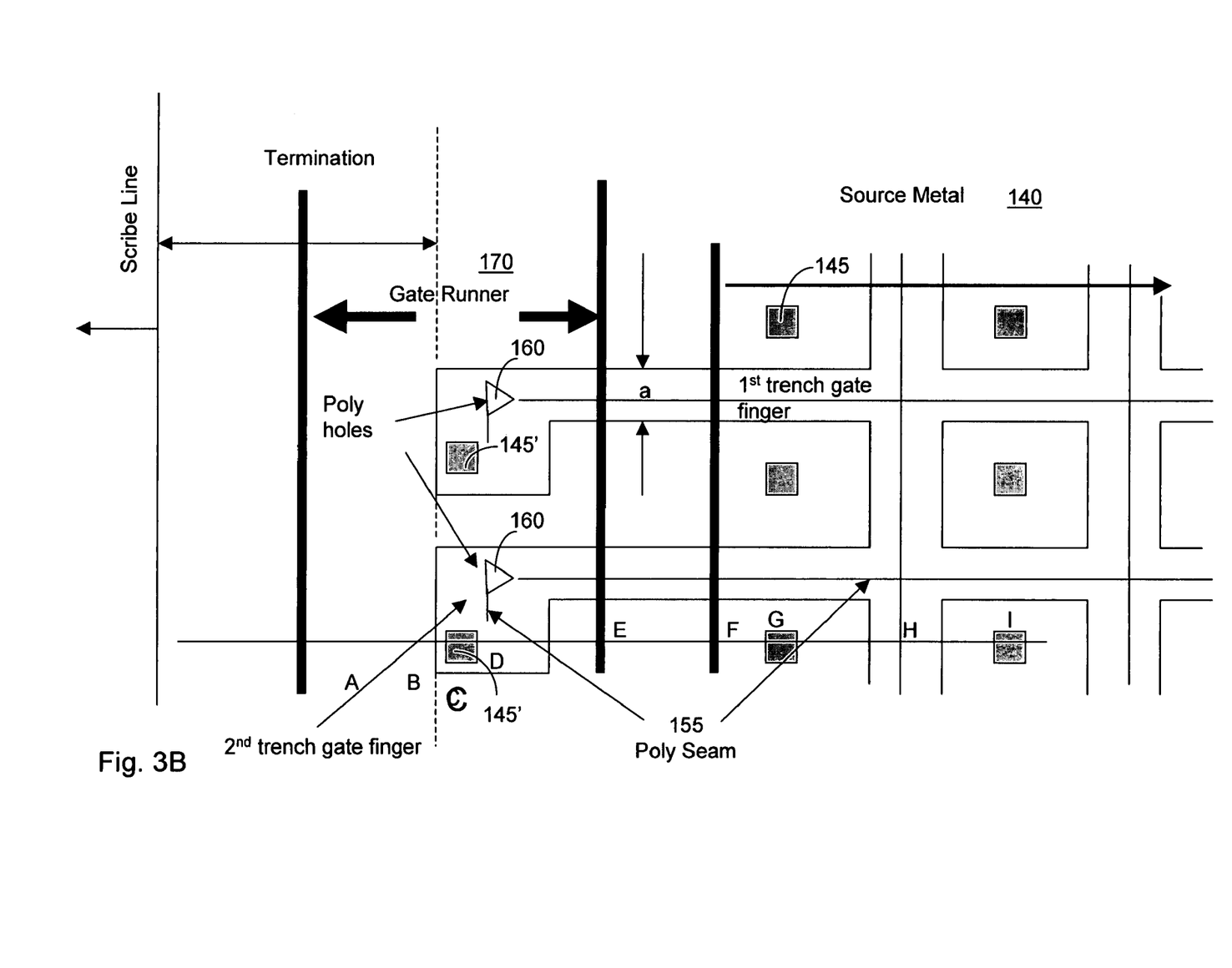
Figure 3C:
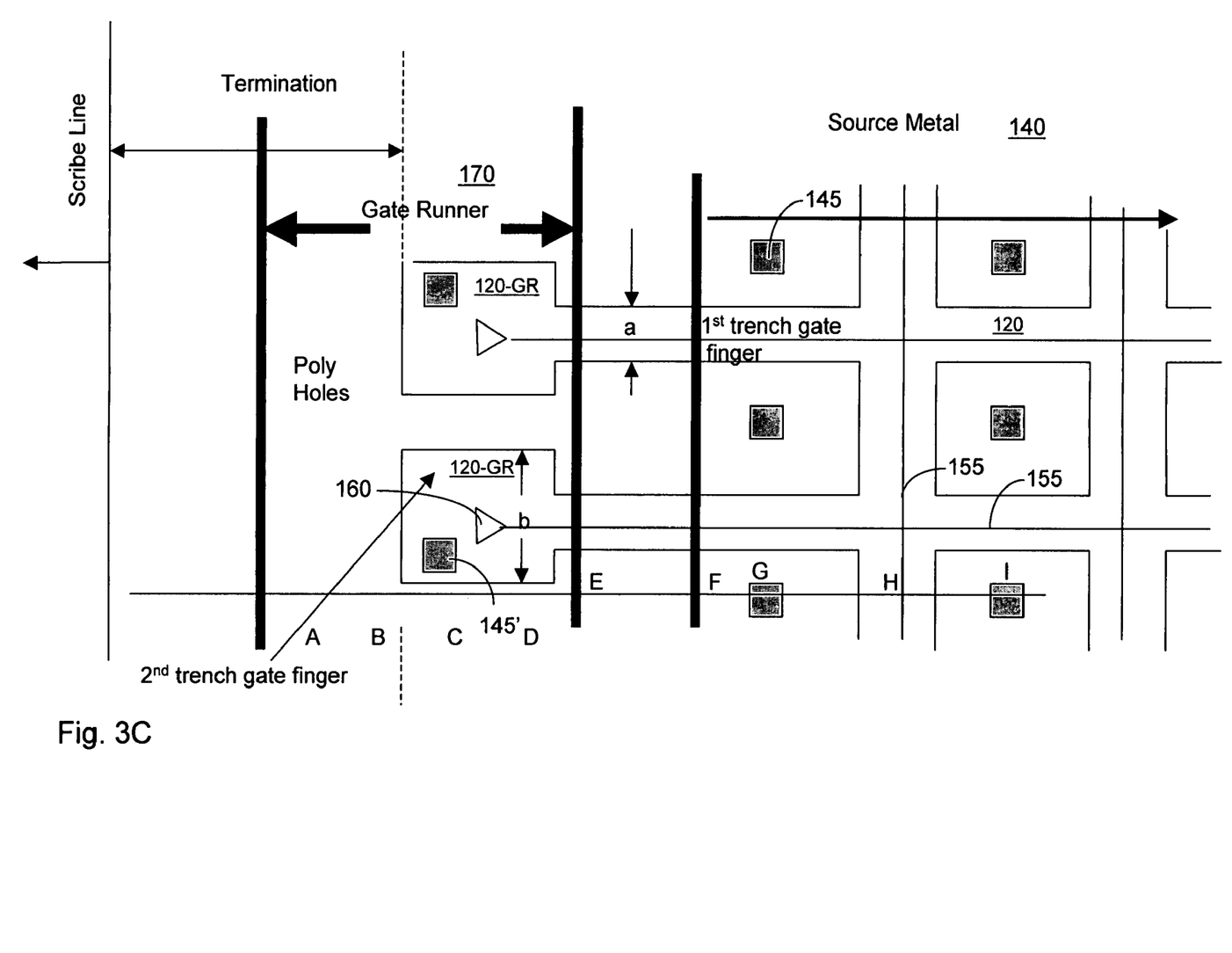

Referring to FIGS. 3A to 3C for another side cross sectional view and two top views of a second preferred embodiment of this invention. A metal oxide semiconductor field effect transistor (MOSFET) device 100 is supported on a substrate 105 formed with an epitaxial layer 110. The MOSFET device 100 includes a trenched gate 120 disposed in a trench with a gate insulation layer 115 formed over the walls of the trench. A body region 125 that is doped with a dopant of second conductivity type, e.g., P-type dopant, extends between the trenched gates 120. The P-body regions 125 encompassing a source region 130 doped with the dopant of first conductivity, e.g., N+ dopant. The source regions 130 are formed near the top surface of the epitaxial layer surrounding the trenched gates 120. The top surface of the semiconductor substrate extending over the top of the trenched gate, the P body regions 125 and the source regions 130 are covered with a NSG and a BPSG protective layers 135. A source metal layer 140 and gate metal runner layer 150 are formed on top of the protective insulation layer 135.

For the purpose of improving the source contact to the source regions 130, a plurality of trenched source contact filled with either a tungsten plug or filed with aluminum alloys 145 that is surrounded by a barrier layer Ti/TiN. The contact trenches are opened through the NSG and BPSG protective layers 135 to contact the source regions 130 and the P-body 125. Then a conductive layer with low resistance (not shown) is formed over the top surface to contact the trenched source contact 145. A top contact layer 140 is then formed on top of the source contact 145. The top contact layer 140 is formed with aluminum, aluminum-cooper, AlCuSi, or Ni/Ag, Al/NiAu, AlCu/NiAu or AlCuSi/NiAu as a wire-bonding layer. The low resistance conductive layer (not shown) sandwiched between the top wire-bonding layer 140 and the top of the trenched source-plug contact 145 is formed to reduce the resistance by providing greater area of electrical contact.

In order to further increase the active areas for ultra high cell density MOSFET device, a specially configured termination structure is disclosed in the present invention. The gate runner metal provides the function of a metal field plate 170 is disposed in the termination area on top of a gate runner 120-GR with a P-body 126 in the source area in connection to the field plate area in the termination. In order to assure good contact to the gate runner 120-GR, a trenched gate runner contact plug 145' is formed on top of the gate runner 120-GR. The gate-runner contact plug 145' is composed of tungsten surrounded by a Ti/TiN barrier layer. For the purpose of avoiding the poly-etch through problem, the tungsten gate-runner contact plugs 145' are formed away from the center seam 155 of the polysilicon gate runner 120-GR.

Figure 3D:
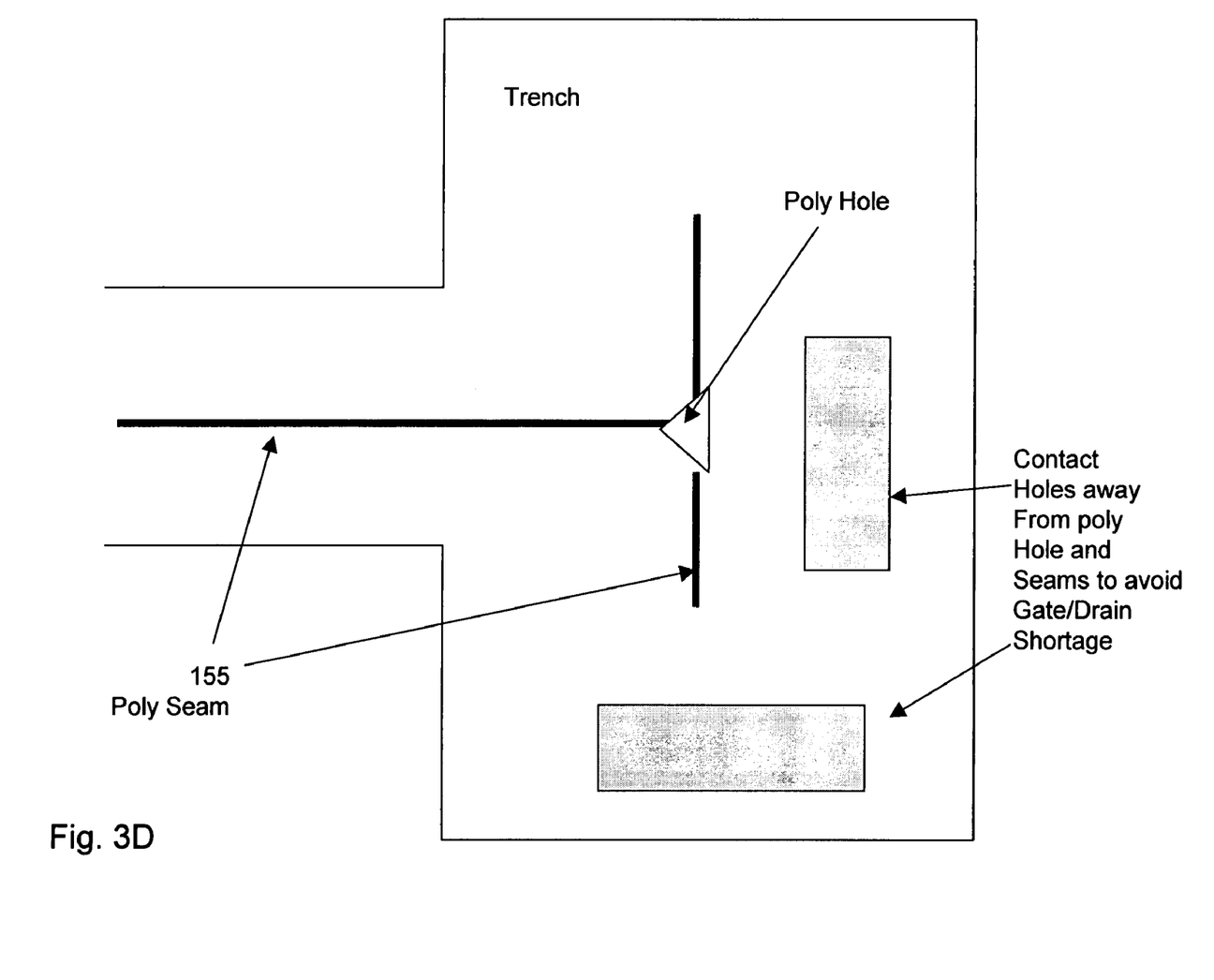

Referring to FIG. 3B for a top view of an exemplary embodiment of this invention to prevent a drain to gate short circuit problem. This drain-to-gate short circuit problem may occur due to the development of polysilicon holes 160 at the T-intersection and along the center of the trenches where the poly seam 155 are developed. The T-intersection is between the trenches in forming the trenched gate 120 and the shortened trench gate 120-GR below the gate runner 150 at the termination area. FIG. 3B shows the trenches 120 extend to the termination area as trench-gate fingers and form an L-shaped intersection with the termination trench 120-GR. The trenches 120 formed as trench-gate fingers have a gate width of "a". The polysilicon holes 160 commonly develop at the intersection points between the trenches 120 and the termination trenches 120-GR. In order to avoid these polysilicon holes 160, the trenched source contact plugs 145 and the trenched gate contact plugs 145' are opened away from the intersection points. FIG. 3C shows another embodiment, where the gate runner 120-GR extends to the termination area underneath the field plate 170 has a greater width than the trench width "a" of the trenches in the active cell area thus provide greater area to allow for forming the gate runner contact openings filled with tungsten plug 145' that is a distance away from the T-intersection area. FIG. 3D shows another embodiment where the contact openings filled with the tungsten plugs 145' are disposed along the peripheral edges of the gate-runner 120-GR. The contact openings are opened away from the center poly-seam 155 and away from the poly holes 160. The problems of etch through and short circuit can be effectively resolved by these kinds of configurations.

Figure 4A:
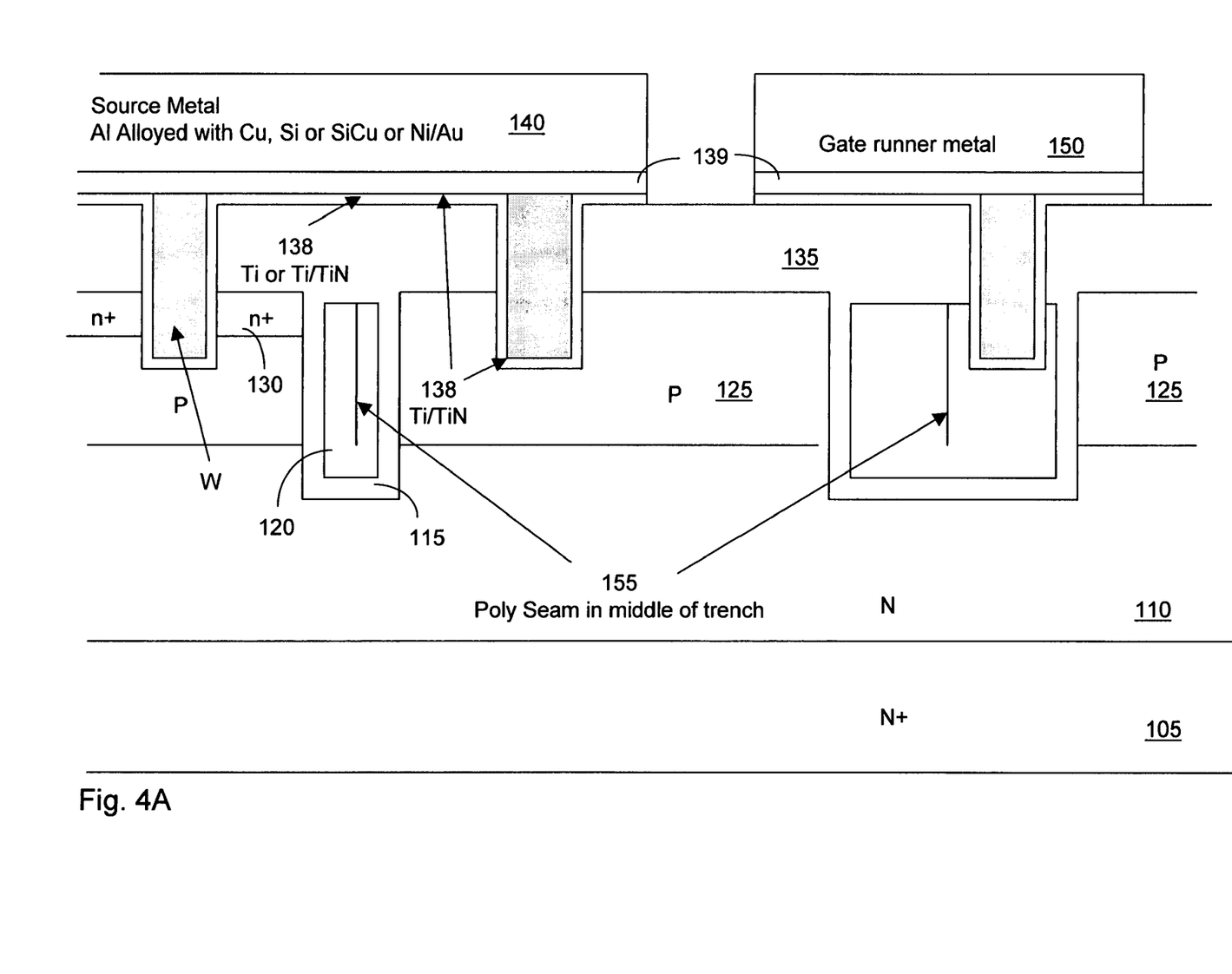
FIGS. 4A. 4B and 5 are cross sectional views of three different preferred embodiment of this invention with improved metal schemes to reduce the resistance of the device.
Figure 4B:
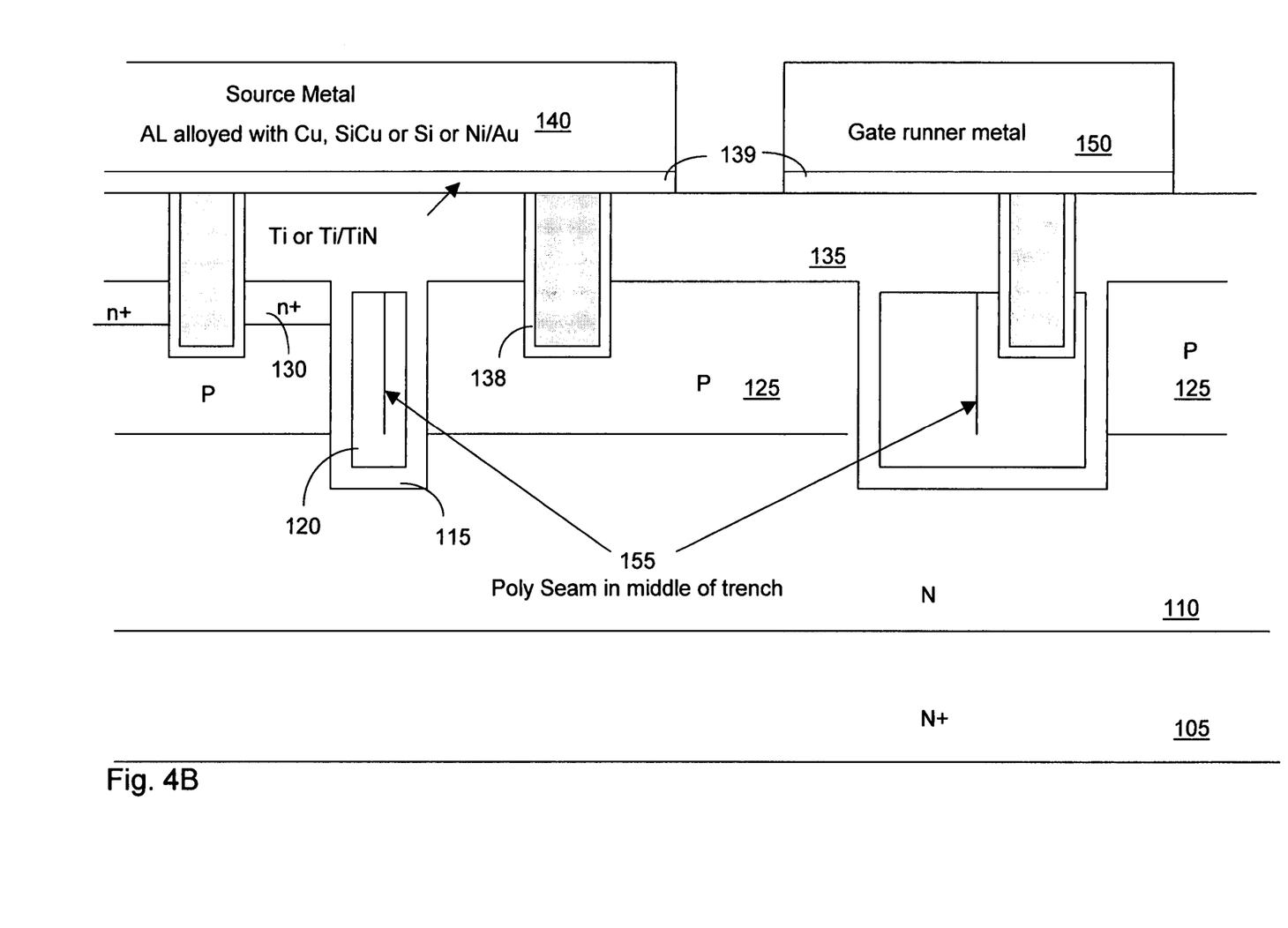
Figure 5:
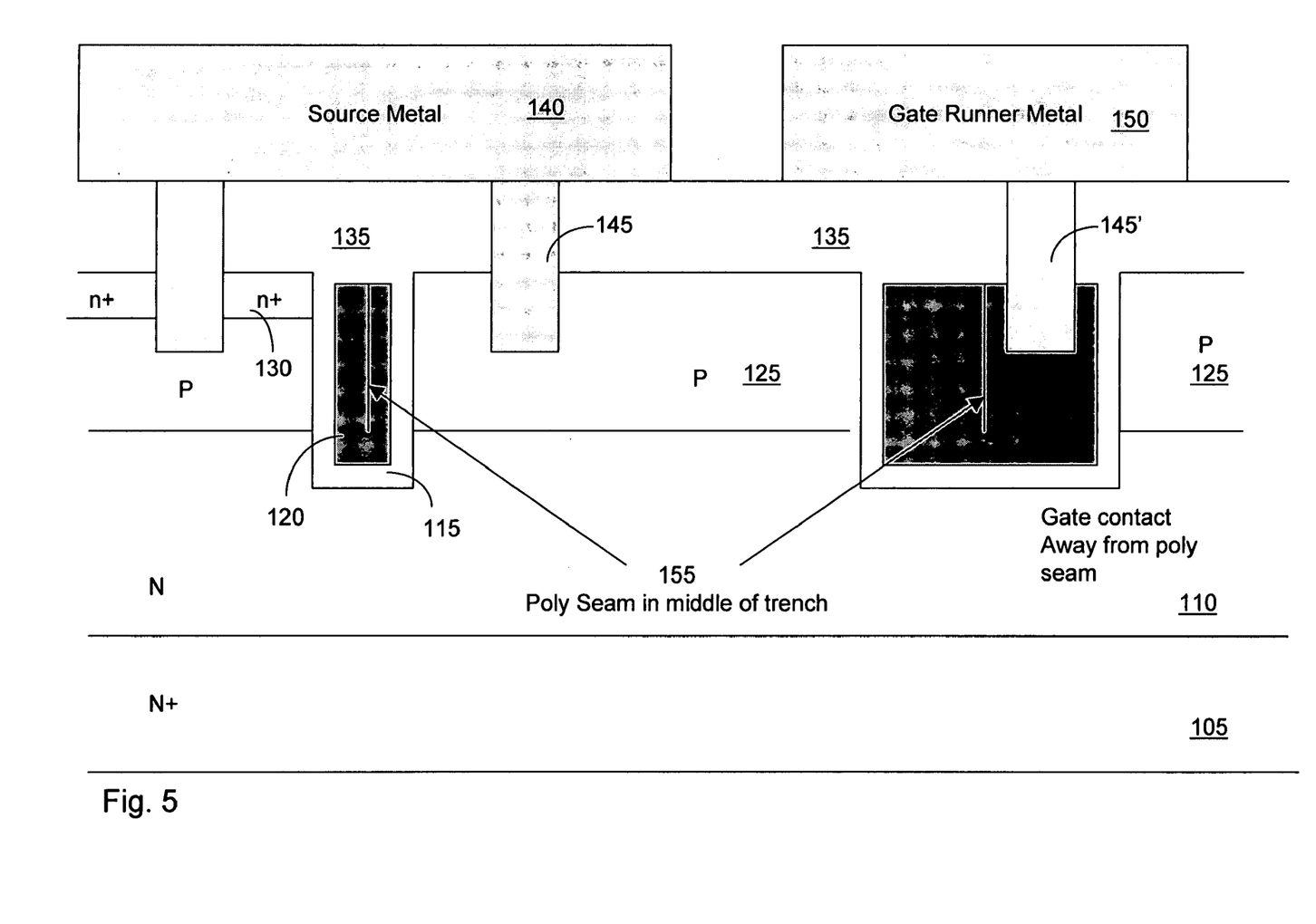

Referring to FIG. 4A for an improved metal scheme of a MOSFET of this invention to further improve the performance of the semiconductor power device. The device configuration is similar to that of FIGS. 2A to 2C with the difference that the source and gate metal contacts 145 are filled with Ti/TiN/W wherein Ti/TiN is provided as a barrier layer surrounding the tungsten plug 145. After an operation of tungsten etch back, the manufacturing process continues with a deposition of a Ti or Ti/TiN layer 138 as a low resistance layer to enhance electric conductivity. Then a thick metal layer that may be composed of aluminum alloys, e.g., aluminum alloys of Cu, Si, or SiCu or Ni/Au is deposited to function as the gate and source metal layer 140 and 150 as shown. FIG. 4B shows a device structure formed with additional Ti/TiN etch-back after the tungsten etch-back before the formation of a Ti or TiN as a low resistance layer. FIG. 5 is a MOSFET device with similar device configuration. The only difference is the source and gate contact openings are filled with Ti/TiN/AlCu or Ti/TiN/AlSiCu or Ti/TiN/AlSi and the source metal and the gate metal layers are composed of the same conductive materials.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. A trenched semiconductor power device comprising a plurality of trenched gates disposed in an extended continuous trench surrounding a plurality of transistor cells in an active cell area and extending as trench-gate fingers to directly connect with a plurality of wider trenched gates underneath a gate runner metal wherein said trenched semiconductor power device further comprising:

at least a gate contact trench opened through an insulation layer covering the semiconductor power device wherein said gate contact trench penetrating through the insulation layer and extending into a trench-filling material in said wider trenched gate wherein said wider trenched gates are opened substantially as rectangular-shaped or square-shaped trenched gates having a plurality of corners and said gate contact trench is located closest to one of the corners relative to all other of the corners of the wider trenched gates.

2. The trenched semiconductor power device of claim 1 wherein:

gate contact trench is disposed closest to the corner of said wider trenched gate diagonally opposite from an intersection between said trench-gate finger and said wider trenched gate.

3. The trenched semiconductor power device of claim 1 wherein:

said wider trenched gate connecting to an end of the trench finger forming a T-shaped trench intersection wherein said gate contact trench is disposed closest to the corner of said wider trenched gate opposite an intersection between said trench-gate finger and said wider trenched gate.

4. A trenched semiconductor power device comprising a plurality of trenched gates disposed in an extended continuous trench surrounding a plurality of transistor cells in an active cell area and extending as trench-gate fingers to directly connect with a plurality of wider trenched gates underneath a gate runner metal wherein said trenched semiconductor power device further comprising:

at least a gate contact trench is opened through an insulation layer covering the semiconductor power device wherein said gate contact trench penetrates through the insulation layer and extends into a trench-filling material in said wider trenched gate underneath said gate runner metal, wherein at least one of said wider gate trenches is opened substantially as a polygon-shaped trench having multiple corners and wherein at least one of said gate contact trenches is disposed closest to one of said corners relative to all other corners of said wider trenched gate constituting an off-center and unsymmetrical trenched gate contact relative to the corners of said wider trenched gate.

5. The trenched semiconductor power device of claim 1 wherein:

said gate contact trench is filled with a tungsten gate contact plug surrounded with a Ti/TiN barrier layer.

6. The trenched semiconductor power device of claim 1 further comprises a MOSFET device and said MOSFET device further comprising:

a plurality of source body contact trenches opened through said insulation layer and filled with metal plugs therein.

7. The trenched semiconductor power device of claim 4 further comprising a plurality of source body contact trenches opened through said insulation layer and filled with a metal plug therein.

8. The trenched semiconductor power device of claim 4 further comprising:

said gate contact trench disposed closest to one of the corners of said wider trenched gate is disposed at a greatest distance from an intersection between said trench-gate finger and said wider trenched gate.

9. The trenched semiconductor power device of claim 4 wherein:

said gate contact trench is filled with a tungsten gate contact plug surrounded with a Ti/TiN barrier layer.

10. The trenched semiconductor power device of claim 1 wherein:

said source and gate contact trench is filled with an Aluminum alloy surrounded with a Ti/TiN barrier layer.

11. The trenched semiconductor power device of claim 1 wherein:

said wider trenched gate underneath gate runner metal is configured as an open stripe extending from and intersecting to said trench-gate fingers as an L-shaped trenched gate underneath gate runner metal with said width of gate contact trench is smaller than half of a width of said wider trench-gate.

12. The trenched semiconductor power device of claim 1 wherein:

said wider trenched gate underneath gate runner metal is configured as an open stripe extending from and intersecting to said trench-gate fingers as an expanded square-shaped trenched gate underneath gate runner metal with said width of gate contact trench is smaller than half of a width of said wider trench-gate.

13. The trenched semiconductor power device of claim 1 wherein:

said wider trenched gate underneath gate runner metal is configured as an open stripe extending from and intersecting to said trench-gate fingers as an expanded rectangular-shaped trenched gate underneath gate runner metal with said width of gate contact trench is smaller than half of a width of said wider trench-gate.

14. The trenched semiconductor power device of claim 1 wherein:

said wider trenched gate underneath gate runner metal is configured as an open stripe extending from and intersecting to said trench-gate fingers as an expanded circular trenched gate underneath gate runner metal with said width of gate contact trench is smaller than half of a diameter of said wider trench-gate.

15. The trenched semiconductor power device of claim 1 wherein:

said trenched gate underneath gate runner metal is configured as a no-open-end trenched gate underneath gate runner metal perpendicularly intersecting to said trench-gate fingers from active area. The width of gate contact trench is smaller than half of a width of said wider trench-gate.

16. The trenched semiconductor power device of claim 1 wherein:

said trenched gate underneath gate runner metal is configured as an open stripe extending from and having a greater width than said trench-gate fingers wherein said open stripe allowing a body-dopant region disposed adjacent to a source region of said semiconductor power device connecting to another body dopant region underneath a gate runner metal whereby said gate runner metal can function as a field plate.

17. The trenched semiconductor power device of claim 1 wherein:

said trenched gate underneath gate runner metal is configured as an open stripe extending from and intersecting to said trench-gate fingers as an L-shaped trenched gate underneath gate runner metal having a greater width than said trench-gate fingers wherein said L-shaped open trenched gate underneath gate runner metal allowing a body region disposed adjacent to a source region of said semiconductor power device connecting to another body dopant region underneath a gate runner metal whereby said gate runner metal can function as a field plate.

18. The trenched semiconductor power device of claim 1 wherein:

said gate contact trench is filled with a contact plug composed of an aluminum alloy surrounded with a Ti/TiN barrier layer.

* * * * *